(12) United States Patent
Ukita et al.

(10) Patent No.: US 6,797,530 B2
(45) Date of Patent: Sep. 28, 2004

(54) SEMICONDUCTOR DEVICE-MANUFACTURING METHOD FOR MANUFACTURING SEMICONDUCTOR DEVICES WITH IMPROVED HEAT RADIATING EFFICIENCY AND SIMILAR IN SIZE TO SEMICONDUCTOR ELEMENTS

(75) Inventors: Yasunari Ukita, Yokohama (JP); Naotake Watanabe, Yokohama (JP); Ikuo Mori, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/253,824

(22) Filed: Sep. 25, 2002

(65) Prior Publication Data

US 2003/0059979 A1 Mar. 27, 2003

(30) Foreign Application Priority Data

Sep. 25, 2001 (JP) ........................................ 2001-290727

(51) Int. Cl.[7] .............................................. H01L 21/00
(52) U.S. Cl. ............................................ 438/26; 438/64
(58) Field of Search .......................... 438/26, 64, 122, 438/113, 114, 119, 460, 465

(56) References Cited

U.S. PATENT DOCUMENTS 6,504,096 B2 * 1/2003 Okubora ..................... 174/52.2
6,521,485 B2 * 2/2003 Su et al. ..................... 438/114

FOREIGN PATENT DOCUMENTS

| JP | 2000-3985 | 1/2000 |
| JP | 2000-77576 | 3/2000 |

* cited by examiner

Primary Examiner—W. David Coleman
(74) Attorney, Agent, or Firm—Oblon, Spivak, McClelland, Maier & Neustadt, P.C.

(57) ABSTRACT

A semiconductor device-manufacturing method includes a laminated wafer formation step and a dicing step. In the laminated wafer formation step, a metal plate is first laid on one side of a wafer with a solder material interposed, and then the metal plate and the wafer are subjected to decompression pressing to form a one-piece structure. As a result, a laminated wafer is obtained. In the dicing step, the laminated wafer is diced into laminated chips.

6 Claims, 5 Drawing Sheets

Decompressed thermal pressing

Stud bump formation

Dicing

Decompressed thermal pressing

Decompressed thermal pressing

Decompressed thermal pressing

SEMICONDUCTOR DEVICE-MANUFACTURING METHOD FOR MANUFACTURING SEMICONDUCTOR DEVICES WITH IMPROVED HEAT RADIATING EFFICIENCY AND SIMILAR IN SIZE TO SEMICONDUCTOR ELEMENTS

CROSS-REFERENCE TO RELATED APPLICATIONS

This application is based upon and claims the benefit of priority from the prior Japanese Patent Application No. 2001-290727, filed Sep. 25, 2001, the entire contents of which are incorporated herein by reference.

BACKGROUND OF THE INVENTION

1. Field of the Invention

The present invention relates to a semiconductor device-manufacturing method, particularly to a heat-radiating step.

2. Description of the Related Art

Usually, a semiconductor device-manufacturing method includes a die-mount step and a connection step. In the former step semiconductor elements are die-mounted on lead frames, and in the latter step the electrodes of the semiconductor elements and lead frames are connected through metal wires.

FIG. 8 illustrates the outline of a semiconductor device-manufacturing method wherein the die-mount step mentioned above is a solder vapor-depositing step. In this method, solder 51 is vapor-deposited on the reverse side 52a of a semiconductor conductor wafer 52 in order to form unseparated semiconductor elements 53. The semiconductor elements 53 are separated by dicing the semiconductor conductor wafer 52 along predetermined lines. Then, the semiconductor elements 53 are mounted on lead frames 54, and the electrodes of the semiconductor elements and the lead frame 54 are connected through metal wires 55, thereby fabricating semiconductor devices 56.

FIG. 9 illustrates the outline of the semiconductor device-manufacturing method wherein the die-mount step mentioned above is a solder pre-coat step. In this method, fused solder 51 is supplied onto lead frames 54, and semiconductor elements 53 formed by dicing the semiconductor conductor wafer 52 are scrub-mounted on the fused solder 51. Then, the connection step is carried out to connects the electrodes of the semiconductor elements 53 to the lead frames 54 by means of metal wires 55, thus fabricating semiconductor devices 56. The "scrub-mounting" is intended to refer to an operation of scrubbing the semiconductor elements 53 and the lead frames 54 against each other in such a manner as to spread the fused solder 51, for joining.

The semiconductor device-manufacturing methods described above have the following problems. That is, when wire bonding is utilized, a semiconductor element is first die-mounted on a lead frame, and then a metal wire is connected to the lead frame. Because of this procedure, the metal wire forms a loop in the region surrounding the semiconductor element, and a dead area is inevitably produced. To be more specific, the land the lead frame has for connection has to be spaced from the semiconductor element more than a predetermined distance. In addition, since the loop is formed from the terminal, a margin corresponding to the height of the loop is needed. As can be seen from this, the conventional methods impose restrictions on the miniaturization of semiconductor devices.

As a method of connecting a lead frame and a semiconductor element without using a wire, connection by flip chip bonding is proposed. In flip chip bonding, bumps are formed on the bonding pads of a semiconductor element, for alignment with the lead frame, and the solder reflow based on the application of heat or ultrasonic vibration executed in a pressure-applied state is utilized for connection.

The manner in which solder is supplied in the die-mount step will be considered. Where the die-mount step is the solder vapor-depositing step, a long time is required for supplying the solder to the reverse side of a semiconductor element. On the other hand, where the die-mount step is the solder pre-coat step, the fused solder cannot be supplied at high speed.

A semiconductor device manufactured in the manufacturing methods described above will be looked at in light of thermal design. Even if a semiconductor device is provided with a heat sink (metal plate) 61, this heat sink 61 is within those portions of sealing resin 62 which are located near a semiconductor element 53, as shown in FIG. 10. With this structure, heat is radiated mainly to a substrate 63 after passing by way of the lead frame 54 and the sealing resin 62, as indicated by arrows "H" in FIG. 10. It is therefore impossible to expect a high heat radiation efficiency.

Recently-developed semiconductor elements are highly integrated and operate at high speed, and therefore generate a large amount of heat. In addition, they have to be arranged at high density since recent electronic devices are very small. As long as the heat sink is embedded within the sealing resin, the semiconductor element may not maintain a normal operating temperature (which depends upon the type of semiconductor element and is normally lower than 80° C. or so), adversely affecting the reliability of the semiconductor element.

BRIEF SUMMARY OF THE INVENTION

Accordingly, an object of the present invention is to provide semiconductor device-manufacturing method for manufacturing semiconductor devices which are approximately the same in size as semiconductor elements and which have an improved heat radiating efficiency.

To solve the problems and to attain the object, the present invention provides semiconductor device-manufacturing methods described below.

A semiconductor device-manufacturing method comprising: a laminated wafer formation step of placing a semiconductor wafer in such a manner that a side having no electrode and no electronic circuit faces a solder material, then laying a metal plate on that side of the semiconductor wafer with a solder material interposed, and then causing the metal plate and the wafer to form a one-piece structure by decompression pressing, thereby obtaining a laminated wafer; and a dicing step of dicing the laminated wafer to form laminated chips.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below and serve to explain the principles of the invention.

DETAILED DESCRIPTION OF THE INVENTION

Figure 1:
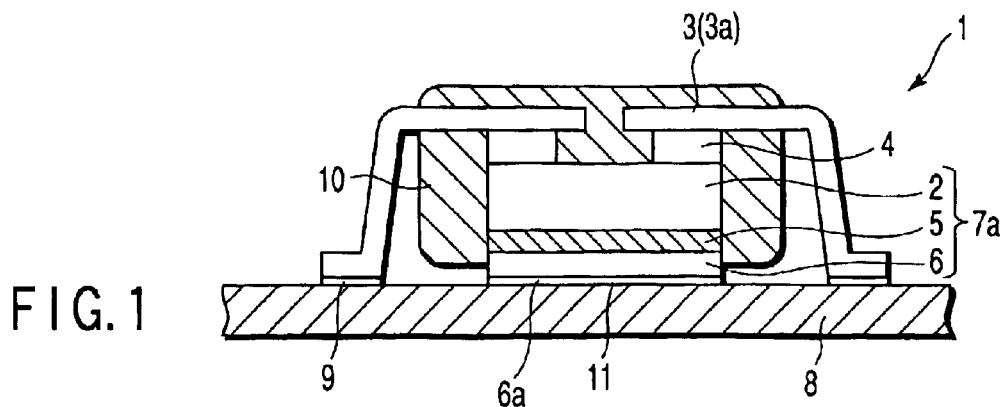
FIG. 1 is a sectional view showing a state where a semiconductor device manufactured in the semiconductor device-manufacturing method according to one embodiment of the present invention is installed on a wiring board.

FIG. 1 is a sectional view showing a state where a semiconductor device 1 manufactured in the semiconductor device-manufacturing method according to one embodiment of the present invention is installed on a wiring board 8. The semiconductor device 1 is provided with a semiconductor element 2. A lead frame 3 is attached to one side 2a of the semiconductor element 2 through a stud bump 4 by flip chip bonding. A metal plate (heat sink) 6 is attached to the other side 2b of the semiconductor element 2 through a solder sheet 5. The metal plate 6 is formed of copper, 42 alloy or the like, and has an area substantially equal to that of the semiconductor element 2. The semiconductor element 2, the solder sheet 5 and the metal plate 6 jointly constitute a laminated chip 7a. The lead frame 3 has a lead 3a subjected to foaming, and the tip end of this lead 3a is substantially flush with the metal plate 6. The outer surfaces of a semiconductor element 2 are sealed with sealing resin 10. The reverse side 6a of the metal plate 6 is not sealed with the resin 10 and exposed, and thus serves as a heat radiating section. An electrode 9 is formed on a wiring board 8.

The semiconductor device 1 is coupled to the wiring board 8 by soldering the lead 3a of the lead frame 3 to the electrode 9. The metal plate 6 is connected to through the wiring board 8. That is, the heat generated by the semiconductor element 2 is radiated through the metal plate 6 and the heat conductor 11. Therefore, since heat can fully be radiated even if the semiconductor element 2 is highly integrated and operates at high speed, the operation of the semiconductor element 2 is not thermally affected. The heat conductor 11 is formed of a solder material, a conductive resin, silicone grease, or the like.

The advantages of providing the solder sheet 5 between the semiconductor element 2 and the metal plate 6 will be described. Solder serves to suppress thermal stress, which may be generated between the semiconductor element 2 and the metal plate 6 due to the difference between their coefficients of thermal expansion. A TCT (temperature cycle test) shows that the use of the solder sheet 5 is effective in preventing cracks and therefore ensures high reliability. In addition, since solder has a high thermal conductivity, it provides an improved heat radiating characteristic. Where the solder sheet 5 is thermally bonded to the wafer by thermal pressing, the semiconductor elements 2 can be fabricated in a short time compared to the case where solder deposition is utilized. Accordingly, the manufacturing cost can be lowered. Since solder need not be melted, it is easy to control the thickness of the solder layer. Moreover, since gas is not generated, defects, such as a void, are not produced, and high reliability is ensured, as confirmed in the TCT.

SnPb eutectic solder (Sn: about 5%), which is generally referred to as lead-rich solder, is used as the soldering material. The melting point of this material is about 300° C. The SnPb eutectic solder may be replaced with SnSb solder (melting point: 245° C.), SnAg solder (melting point: 221° C.), SnCu solder (melting point: 227° C.), or the like. Since these solder materials have low melting points, they become adhesive in the solid-phase state when heated to about 200° C.

A description will now be given of a method for manufacturing the semiconductor device 1 described above. Roughly speaking, the manufacturing method of a semiconductor device 1 is divided into a laminated wafer formation step for manufacturing a laminated wafer 7, and an assembling step for mounting the laminated wafer 7 on the lead frame and assembling the semiconductor device 1.

Figure 2A:
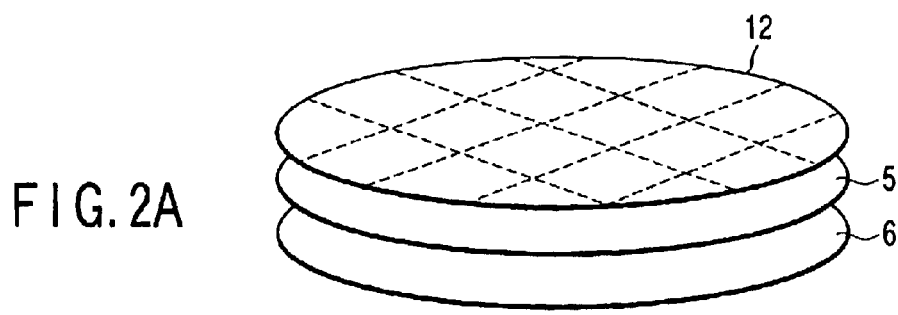
FIGS. 2A to 2D are perspective views schematically illustrating a step of manufacturing a laminated wafer used for fabricating the semiconductor device.
Figure 2B:
Figure 2C:
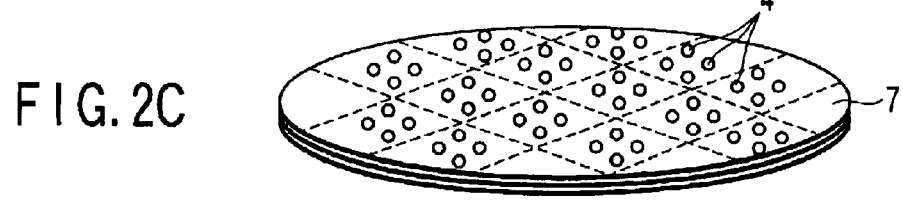
Figure 2D:
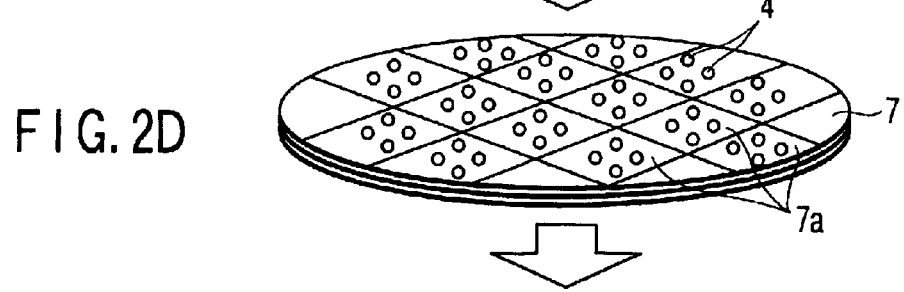

FIGS. 2A to 2D are schematic diagrams illustrating a process for manufacturing a laminated wafer 7. First of all, as shown in FIG. 2A, a wafer 12, a solder sheet 5, and a metal plate 6 are laid one upon another, and positioned in the laid state. After positioning, they are placed in the pressure application section of the pressing machine mentioned later. At the time, an electronic circuit is formed on one surface of the wafer 12, and this circuit formation surface is exposed. The pressing machine is operated for decompressed thermal pressing. As a result, a laminated wafer 7 such as that shown in FIG. 2B is obtained. Next, as shown in FIG. 2C, Au stud bumps 4 are formed at the predetermined positions on the circuit formation surface of the laminated wafer 7. These stud bumps 4 are formed by ball bonding, for example. Lastly, as shown in FIG. 2D, the laminated wafer 7 is diced into elements of predetermined size. As a result, laminated chips 7a are formed.

Figure 3:
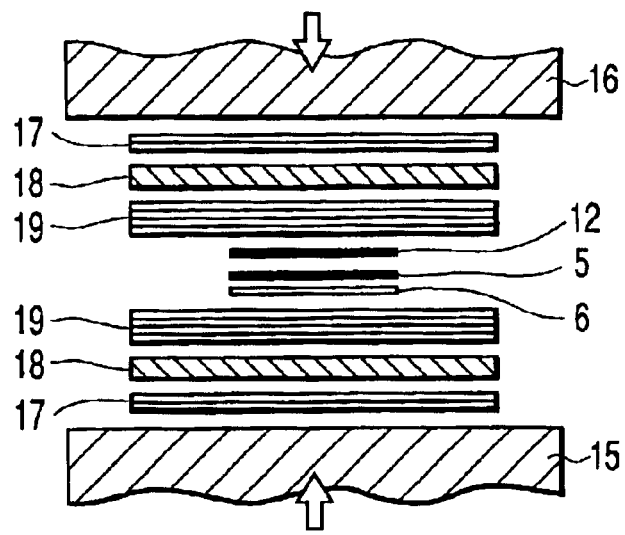
FIG. 3 is a sectional view schematically showing the pressure application section of a pressing machine used in the manufacturing method.

FIG. 3 is an explanatory view showing how the pressing machine applies pressure for decompressed thermal pressing. The pressing machine comprises an upper die and a lower die 15 facing each other. A heater (not shown) is built in each die. The wafer 12, the solder sheet 5 and the metal plate 6 are disposed between the dies 15 and 16 and subjected to positioning in the stated state. A three-layered structure, which is made up of kraft paper 17, a SUS board 18 having a thickness of about 1.0 mm, and a shock absorber formed of PTFE resin (polytetrafluoride ethylene), is interposed between the upper die 16 and the wafer 12. Likewise, a similar three-layered structure is interposed between the lower die 15 and the metal plate 6. The kraft paper 17 is used for preventing scratches.

The wafer 12, the solder sheet 5 and the metal plate 6 are pressed at 210° C. (which is lower than the melting point of the solder) in a decompressed state (pressure: 50 to 100 kg/cm$^2$). The pressurization time is 5 to 15 minutes. It should be noted that the term "decompressed thermal pressing" is intended to mean an operation of pressing an object in a decompressed atmosphere, with heat applied to the object.

Figure 4A:
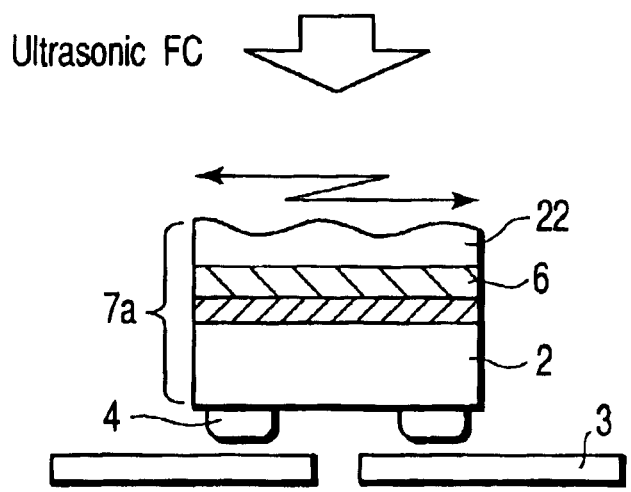
FIGS. 4A to 4C are sectional views schematically illustrating the assembling step of the manufacturing method.
Figure 4B:
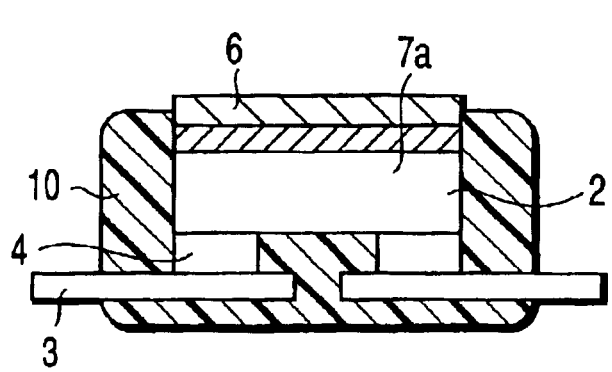
Figure 4C:
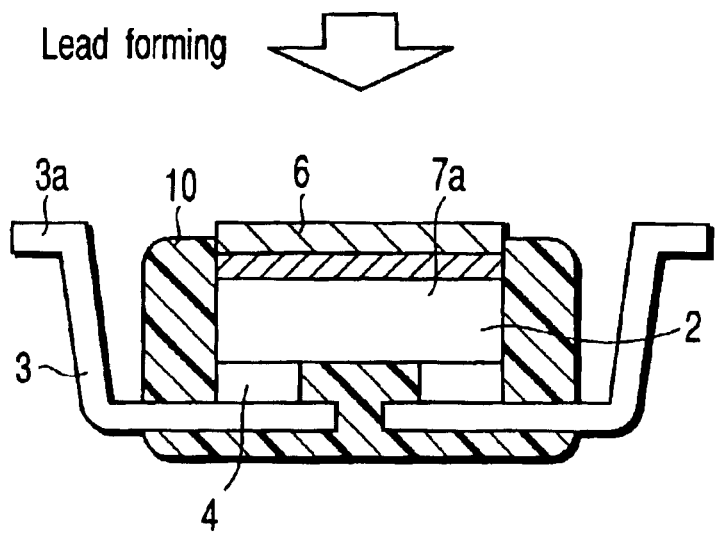

FIGS. 4A to 4C are explanatory diagrams illustrating an assembling step in which the laminated wafer 7 formed as above is mounted on a lead frame 3 and is then subjected to predetermined treatment. As shown in FIG. 4A, the laminated chip 7a is moved down, with the metal plate 6 adsorbed by the mounter head 22 of a mounter (not shown). The laminated chip 7a is attached to the lead frame 3 by ultrasonic flip chip bonding, with stud bumps 4 interposed.

Next, as shown in FIG. 4B, the outer surfaces of the semiconductor element 2 are sealed with sealing resin 10, such as an epoxy resin, thereby fixing the laminated chip 7 to the lead frame 3. Next, as shown in FIG. 4C, the lead 3a of the lead frame 3 is shaped by press forming in such a manner that the lead 3a has a predetermined shape and extends in the same direction as the surface of the metal plate 6 (lead forming). The tip end of the lead 3a formed by this lead forming is substantially flush with the surface of the metal plate 6.

As described above, in the semiconductor device-manufacturing method according to the embodiment of the present invention, the wafer 12 and the metal plate 6 for radiation are attached to each other, and the resultant structure is diced into laminated chips 7a. Semiconductor devices 1 are fabricated, using these laminated chips 7a. Since the semiconductor devices 1 fabricated in the method of the present invention incorporate a metal plate for heat radiation, they ensure satisfactory heat radiation, and yet they have substantially the same size as the semiconductor elements 2.

In addition, the steps of the method of the present invention are similar to those of ordinary semiconductor device-manufacturing methods. Therefore, there is no need for employing special apparatuses. Without using such apparatuses, it is possible to provide semiconductor devices which are small in size and has an improved heat radiation characteristic.

The method for forming the laminated wafers 7 is not limited to the method described above. As will be described later with reference to FIGS. 5A, 5B–7A, 7B, a wafer 12 and a metal plate 16 may be laid one upon the other to form a laminated member. Similar advantages to those mentioned above can be obtained in this method as well.

Figure 5A:
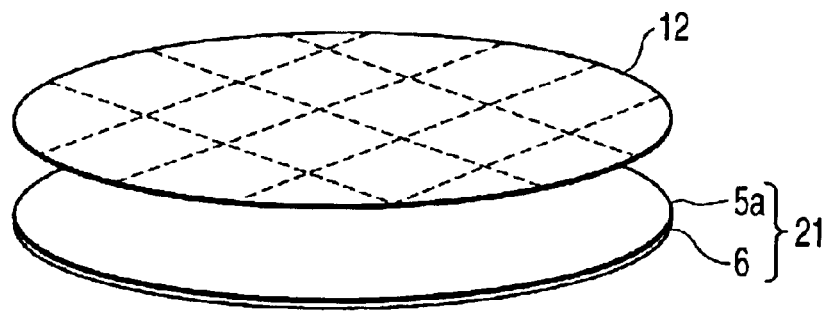
FIGS. 5A and 5B are explanatory diagrams illustrating the first modification of the laminated wafer formation method used in the manufacturing method.
Figure 5B:
Figure 5B:
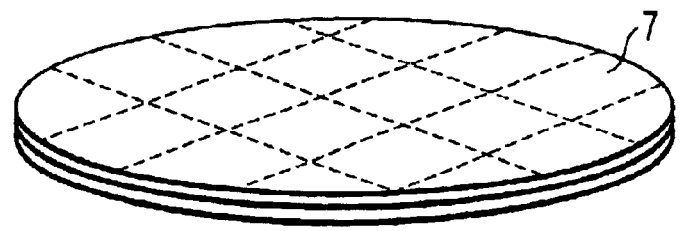

FIGS. 5A and 5B are explanatory diagrams showing the first modification of the method for forming the laminated wafer 7. According to this modification, a clad material made up of a solder plate 5a and a metal plate 6 is prepared independently of a wafer 12. The clad material 21 is formed by rolling the solder plate 5a and the metal plate 6 in such a manner that the total thickness of them becomes a predetermined value. The wafer 12 and the clad material 21 are laid one upon the other in such a manner that the solder plate 5a of the clad material 21 is in contact with the wafer 12. The resultant structure is laid in the pressure application section of the pressing machine, and the pressing machine is operated to execute decompressed thermal pressing for 10 minutes or so. By this pressing, a laminated wafer such as that shown in FIG. 5B is formed.

Figure 6A:
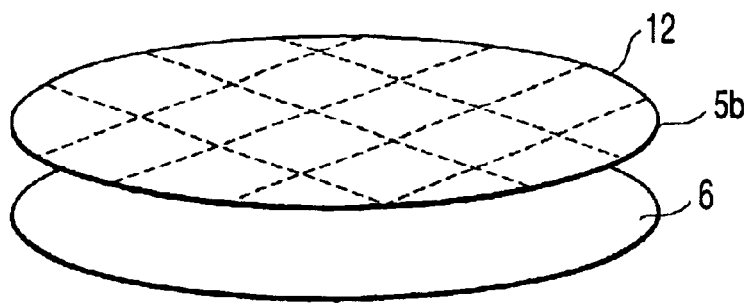
FIGS. 6A and 6B are explanatory diagrams illustrating the second modification of the laminated wafer formation method used in the manufacturing method.
Figure 6B:
Figure 6B:
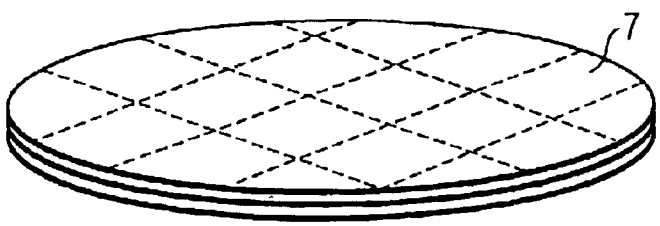

FIGS. 6A and 6B are explanatory diagrams showing the second modification of the method for manufacturing the laminated wafer 7. According to this modification, a wafer 12 having a thin solder coating 5b deposited thereon is prepared independently of a metal plate 6. After the wafer 12 and the metal plate 6 are positioned relative to each other in the stacked state, they are placed in the pressure application section of the pressing machine, and the pressing machine is operated to execute decompressed thermal pressing for 10 minutes or so. By this pressing, a laminated wafer 7 such as that shown in FIG. 6B is formed.

Figure 7A:
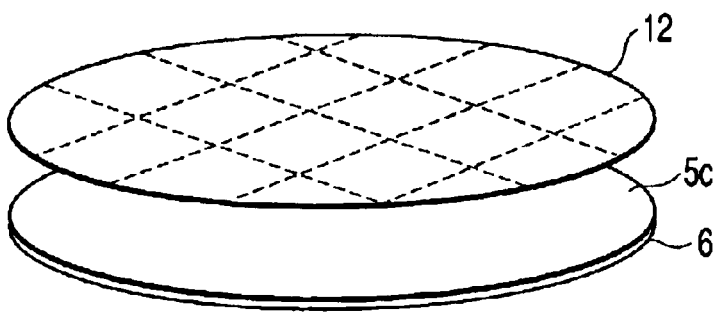
FIGS. 7A and 7B are explanatory diagrams illustrating the third modification of the laminated wafer formation method used in the manufacturing method.
Figure 7B:
Figure 7B:
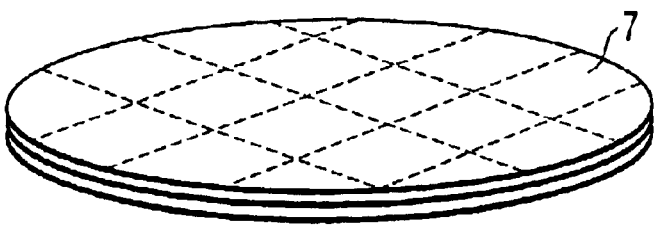
Figure 8:
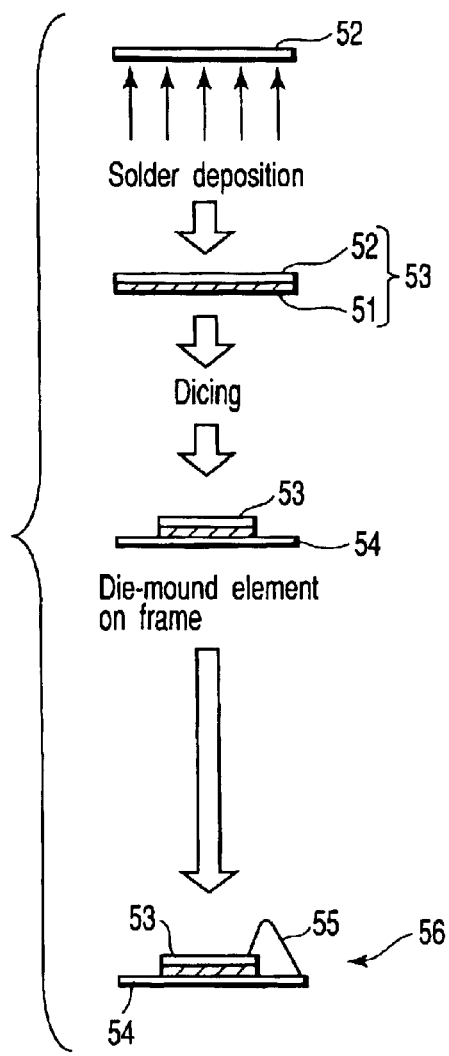
FIG. 8 is an explanatory diagram illustrating an example of a die mount step adopted in a conventional semiconductor device-manufacturing method.
Figure 9:
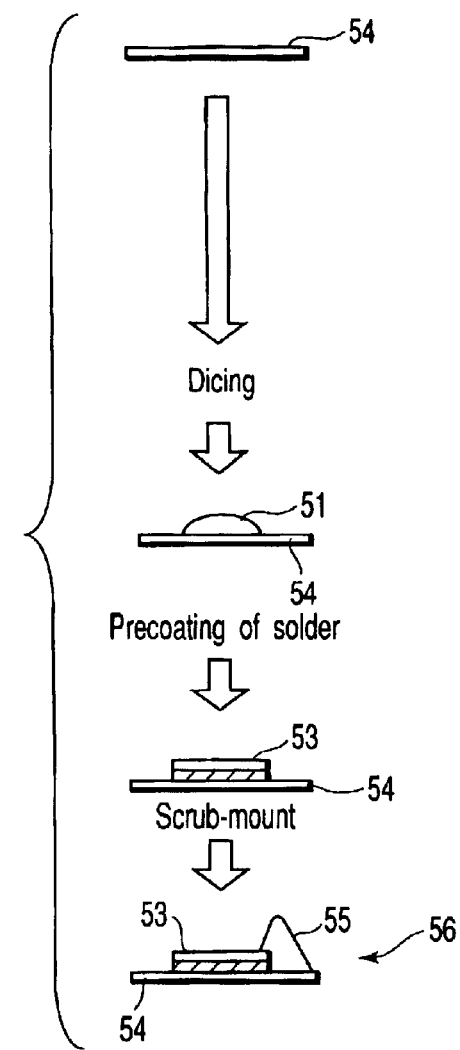
FIG. 9 is an explanatory diagram illustrating another example of a die mount step adopted in the conventional semiconductor device-manufacturing method.
Figure 10:
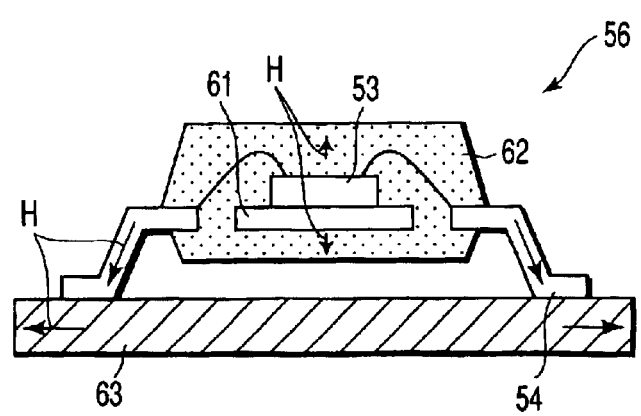
FIG. 10 is a sectional view showing a semiconductor device manufactured in the conventional semiconductor device-manufacturing method.

FIGS. 7A and 7B are explanatory diagrams showing the third modification of the method for forming the laminated wafer 7. According to this modification, a metal plate 6 coated with solder plating 5c is prepared independently of a wafer 12. After the wafer 12 and the metal plate 6 are positioned relative to each other in the stacked state, they are placed in the pressure application section of the pressing machine, and the pressing machine is operated to execute decompressed thermal pressing for 10 minutes or so. By this pressing, a laminated wafer 7 such as that shown in FIG. 7B is formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device-manufacturing method comprising:

a laminated wafer formation step of laying a metal plate with a solder sheet interposed on a side of a semiconductor wafer opposite to a side on which an electric circuit is formed, and then causing the metal plate and the wafer to form a one-piece structure by decompression pressing, thereby obtaining a laminated wafer; and a dicing step of dicing the laminated wafer to form laminated chips.

2. A semiconductor device-manufacturing method according to claim 1, further comprising a bump formation step of forming a bump on an electronic circuit on a semiconductor wafer surface of the laminated wafer;

an installation step of connecting each of the laminated chips to a lead frame through the bump; and a sealing step of sealing outer surfaces of each of the laminated chips installed on the lead frame by means of sealing resin.

3. A semiconductor device-manufacturing method according to claim 1, wherein, in the laminated wafer formation step, the wafer, the solder sheet made by solder material and the metal plate are laminated.

4. A semiconductor device-manufacturing method according to claim 1, wherein, in the laminated wafer formation step, the wafer and a clad material on formed of the metal plate and a solder plate made by solder material are laminated.

5. A semiconductor device-manufacturing method according to claim 1, wherein, in the laminated wafer formation step, the wafer and the metal plate are laminated in a state where solder is deposited on one side of the wafer.

6. A semiconductor device-manufacturing method according to claim 1, wherein, in the laminated wafer formation step, the wafer and the metal plate are laminated in a state where the metal plate is coated with solder plating.

* * * * *